United States Patent
Eitel (10) Patent No.: US 8,855,546 B2
(45) Date of Patent: Oct. 7, 2014

(54) SATELLITE RECEIVER, METHOD FOR OPERATING A SATELLITE RECEIVER, COMPUTER PROGRAM AND SATELLITE SYSTEM

(75) Inventor: Ben Eitel, Gärtringen (DE)

(73) Assignee: SONY Corporation, Tokyo (JP)

( * ) Notice: Subject to any disclaimer, the term of this patent is extended or adjusted under 35 U.S.C. 154(b) by 333 days.

(21) Appl. No.: 13/417,506

(22) Filed: Mar. 12, 2012

(65) Prior Publication Data

US 2012/0282870 A1 Nov. 8, 2012

(30) Foreign Application Priority Data

May 2, 2011 (EP) .................................... 11003574

(51) Int. Cl.
*H04H 20/74* (2008.01)
*H03J 1/00* (2006.01)
*H04H 60/41* (2008.01)
*H04H 40/90* (2008.01)

(52) U.S. Cl.
CPC .............. *H04H 40/90* (2013.01); *H03J 1/0091* (2013.01); *H04H 60/41* (2013.01)
USPC ............. 455/3.02; 455/430; 455/454; 455/20

(58) Field of Classification Search
CPC ............................ H04B 1/7097; H03J 1/0091

USPC ........ 455/3.02, 430, 428, 454, 13.1, 20, 63.3, 455/67.11, 150.1, 130, 226.1, 161.1; 725/63, 68; 375/147, 345, 316, 260

See application file for complete search history.

(56) References Cited

U.S. PATENT DOCUMENTS

| | | | | | |
|---|---|---|---|---|---|
| 5,689,271 | A | * | 11/1997 | Lennen | 342/357.69 |
| 7,684,467 | B2 | * | 3/2010 | Li et al. | 375/147 |
| 2006/0174282 | A1 | * | 8/2006 | Dennison et al. | 725/68 |
| 2006/0225100 | A1 | * | 10/2006 | James et al. | 725/63 |
| 2010/0047852 | A1 | | 2/2010 | Ford | |

* cited by examiner

*Primary Examiner* — John J Lee
(74) *Attorney, Agent, or Firm* — Oblon, Spivak, McClelland, Maier & Neustadt, L.L.P.

(57) ABSTRACT

A satellite receiver that is operable in a single cable system and that is configured to receiver satellite signals via an interface, comprises a controller configured to instruct the interface to perform a blind channel scan process over a predetermined frequency range to obtain measured spectrum signals and to change the predetermined frequency range until a desired frequency range has been measured. The satellite receiver further comprises a processing device configured to receive the measured spectrum signals, to process the measured spectrum signals to obtain a spectrum section and to concatenate the measured spectrum sections to obtain a spectrum.

19 Claims, 7 Drawing Sheets

SATELLITE RECEIVER, METHOD FOR OPERATING A SATELLITE RECEIVER, COMPUTER PROGRAM AND SATELLITE SYSTEM

FIELD OF THE INVENTION

The present specification generally relates to a satellite receiver and a method for operating a satellite receiver. The specification further refers to a computer program and to a satellite system.

BACKGROUND OF THE INVENTION

Satellite broadcasting of communication signals has become a common place. In particular, single cable distribution is widely spread used. The single cable distribution is a satellite TV technology according to which multiple users, for example in a building, receive broadcast programming over a single coaxial cable.

Related technologies are known from U.S. Pat. No. 7,684,467, US 2006/0174282, WO 2010/047852 and US 2006/0225100.

SUMMARY OF THE INVENTION

It is an object of the present invention to provide an improved satellite receiver, an improved method for operating a satellite receiver, an improved computer program and an improved satellite system.

The above objects are achieved by the claimed matter according to the independent claims.

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

Figure 1:
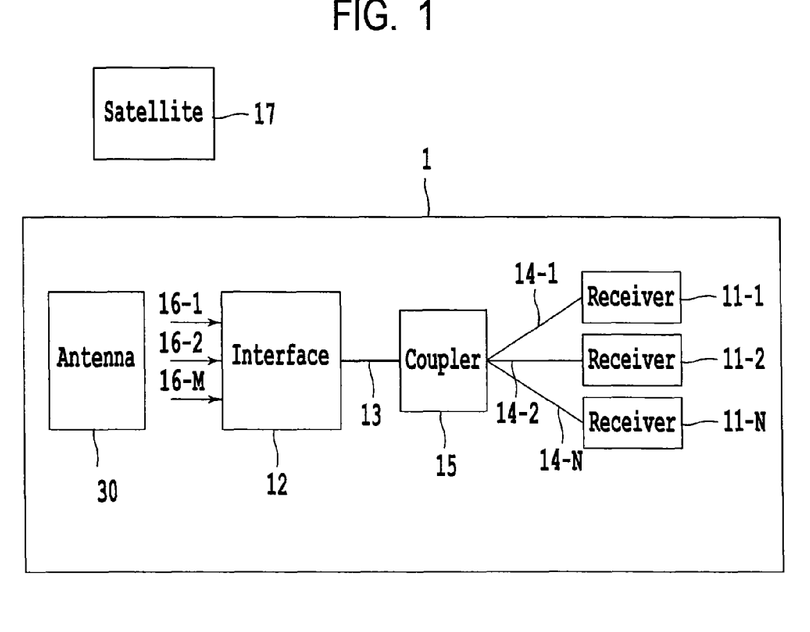
FIG. 1 is a block diagram of a communication system including a receiver in accordance with one embodiment of the present application.

FIG. 1 shows a communication system according to an embodiment of the present application. The system comprises an interface 12 that receives satellite signals from an antenna 30 and transmits the received signals to single receivers 11-1, 11-2, . . . 11-N via a single cable connection 13. Examples of the receiver 11 comprise a stand-alone receiver, a set-top box, a built-in component of a television, a DVD-recorder, a computer or others. The receiver 11 may, for example, be connected with a television apparatus. The interface 12 may be a single cable interface (SCIF) that may be embedded in a single cable router (SCR), a LNB (low noise block) or a suitable switch. A receiver 11 may integrate one or more demodulators. The antenna may be any kind of antenna, which is configured to receive signals from communication satellites 17. Examples of the antenna may comprise satellite dishes or other suitable antennas for receiving the signals. The antenna 30 may comprise several antenna devices, which may be, for example, assigned to different satellites 17. Nevertheless, as is clearly to be understood, one single antenna 30 may receive signals from a plurality of satellites. Usually, the antenna 30 receives signals over the broadband spectrum of the satellite signals (e.g. between 1 and 2 GHz). Generally, the signals received by the antenna are assigned to banks, which are defined as a group of received contiguous channels which belong to a polarization and/or a band (for example, low band, high band, horizontal polarization, vertical polarization). The bandwidth of the single cable (coaxial cable) 13 is divided into slots or user bands. Each demodulator being a component of a satellite receiver is allocated a slot. The interface 12 transmits signals to one of the satellite receivers 11-1, 11-2, . . . 11-N in the allocated slot. The interface 12 is remotely controlled by the satellite receiver 11 via DiSEqC (digital bus satellite equipment control) commands.

The single cable connection 13 usually is implemented by a coaxial cable that may transmit both bidirectional data/signals and power. The structure and the functionality of the DiSEqC signals are explained in the respective literature referring to the standard. Usually, in order to select a desired channel of the satellite signal, the receiver 11 or demodulator of the receiver 11 sends a DiSEqC command to the interface. The DiSEqC command includes information about the bank (band, feed, polarization) that carries the desired signal, information about the frequency of the desired signal and information about the slot, on which the desired signal is expected. Generally, the receiver does not receive a direct feedback whether commands or information submitted by a DiSEqC command uplink have been properly received. Rather, such a piece of information is transmitted in an indirect manner. For example, for getting a feedback the receiver may send an "interrogation" message including information about a slot on which the answer is expected, information about the type of information that is checked, and a number that is compared with a value stored in the database of the interface 12. The request is answered by the interface by giving a binary response indicating whether the number matches with data stored in the database of the interface. For example, the binary response is given by a cw RF tone. "YES" is answered, if the frequency of the RF tone matches with the center frequency of the slot. "NO" is answered, if the frequency of the RF tone is different from the center frequency of the slot. In other words, due to the communication protocol used, it can be indirectly determined whether the DiSEqC signal has been properly received by the interface or not.

The power splitter or directional coupler 15 is operable to transmit the signals from the single cable connection 13 to each of the receivers 11-1, . . . 11-N via cables 14-1 . . . 14-N.

Figure 2:
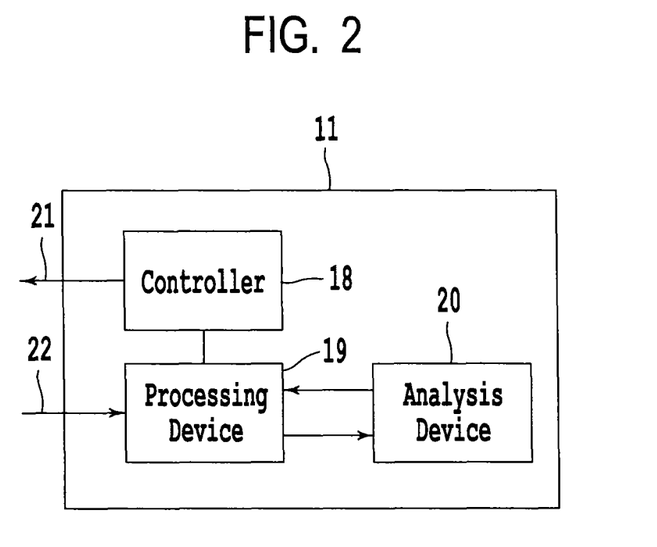
FIG. 2 shows a block diagram of a portion of a receiver in accordance with one embodiment of the present application.

FIG. 2 shows elements of a receiver 11 according to an embodiment of the present application. The general components of a receiver have been described in more detail elsewhere. In addition to the components that provide the basic functionality of the receiver, the receiver 11 may comprise a controller 18 and a processing device 19. According to a further embodiment, the receiver 11 may additionally comprise an analysis device 20. As is to be clearly understood, the controller 18, the processing device 19, and the analysis device may perform a special functionality of more general components of the receiver. For example, the controller that performs the basic functionality of the receiver may additionally perform the functionality that will be described herein below. Alternatively, the controller 18 described may be a separate component of the receiver 11. Likewise, the general processor of the receiver may integrate the processing device 19 and the analysis device 20. Alternatively, the processing device 19 and the analysis device may be separate components of the receiver 11. For example, the processing device 19, the analysis device 20, and the controller 18 may be implemented as integrated circuits.

For satellites having direct access to the whole broadband spectrum of the satellite signal a technology called blind channel scan or search (BCS) is known. This technology relies on the idea of measuring the broadband spectrum of the satellite signal (e.g. between 1 and 2 GHz) and to analyze the power density. From analyzing the power density, the frequency position of available transponders can be estimated in a very fast and efficient way. Usually, the information obtained by such a blind channel scan including the transponders and the position of the frequency for each of the transponders is summarized in a table and, for example, stored in the receiver. The controller 18 shown in FIG. 2 may be configured to instruct the interface 12, shown in FIG. 1, to perform a blind channel scan process over a predetermined frequency range to obtain measured spectrum signals. Then, the controller 18 may change the predetermined frequency range to a neighboring frequency range and instruct the interface 12 to perform a blind channel scan process over the changed frequency range to obtain further measured spectrum signals. This procedure is repeated until a desired frequency range has been measured. In other words, the measured spectrum signals are measured section-wise. The processing device 19 receives the measured spectrum signals and processes the measured spectrum signal to obtain a spectrum section. Thereafter the measured spectrum sections are concatenated so as to obtain a spectrum.

Figure 3A:
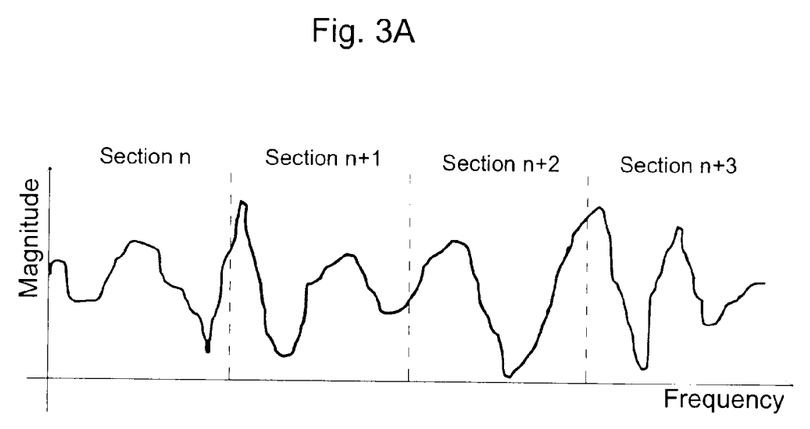
FIGS. 3A and 3B show examples of a spectrum that may be obtained by the receiver in accordance with an embodiment of the present application.

Accordingly, for performing such a blind channel scan over the whole broadband spectrum in a single cable system, in which only a band-limited spectrum of a single user band slot can be received, the receiver sends a blind channel request to the interface. The corresponding DiSEqC command includes the desired section of the broadband spectrum, for example, the range from 1 GHz to 1.1 GHz. In response to the transmitted DiSEqC command, the interface transmits signals to the specific receiver in the predetermined frequency range from 1 GHz to 1.1 GHz (corresponding to section n in FIG. 3A). Thereafter, the received signal is processed by the processing device to obtain a spectrum section. Further, the controller sends the next DiSEqC command to the interface specifying section n+1, i.e. the frequency range of 1.1 GHz to 1.2 GHz. This procedure is repeated until the whole portion from section n to section n+m has been measured. The spectrum sections obtained are concatenated to obtain the spectrum shown in FIG. 3A, for example.

Figure 3B:
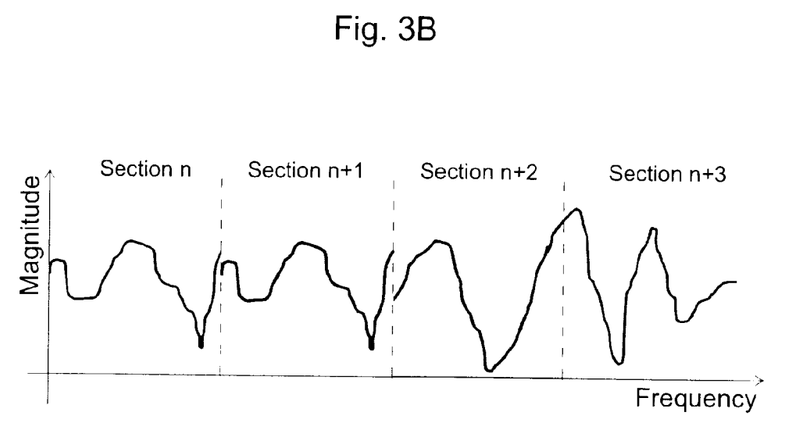

A pre-requisite for this spectrum plot to be correct is that all sections are correctly measured. This in turn implies that the SCIF control by the satellite receiver, in particular the correct setting of the desired frequency range, is not disturbed during the blind channel scan. However, problems may arise since the DiSEqC control sequences sent by several different receivers are transmitted over the same cable. In other words, the single coaxial cable installation actually implements a multi-master to one slave architecture, whereby collisions of the DiSEqC control sequences issued by different receiver units are quite likely. For example, the collision of two or more control sequences may lead either to a complete loss of the control information or to a distortion of the control sequence such that the SCIF interprets the received control information as a different control message. Moreover, the situation may arise that the frequency control command to set the center frequency for section n+1 was not properly received by the interface such that section n is accidently measured twice. In such a case, one would obtain the spectrum shown in FIG. 3B, in which the spectrum for section n+1 is identical with the spectrum shown for section n.

According to an embodiment, the receiver 11 may further comprise an analysis device 20 which may detect a transmission error by means of analyzing the spectrum. For example, the analysis device may analyze the spectrum transition between two adjacent sections. If a kind of a discontinuity of the measured spectrum is detected at the boundary, there is a specific likelihood of a transmission error. For example, referring to FIG. 3B, a discontinuity can be detected at the boundary between sections n and n+1 or between sections n+1 and n+2.

Figure 4A:
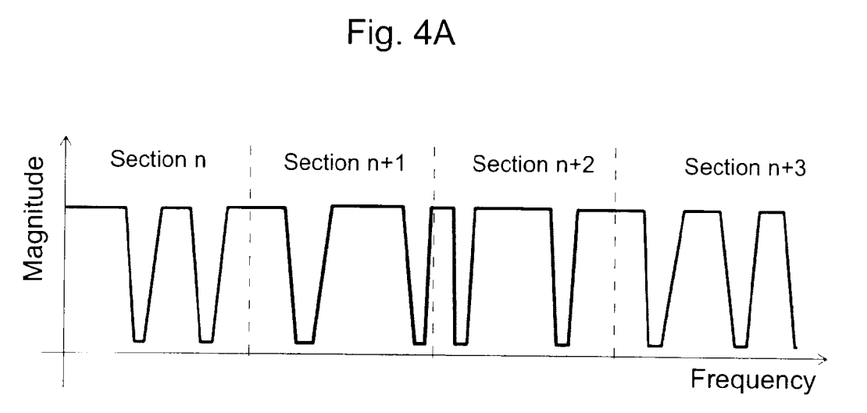
FIGS. 4A and 4B show a further example of a spectrum that may be obtained by the receiver according to an embodiment of the present application.
Figure 4B:
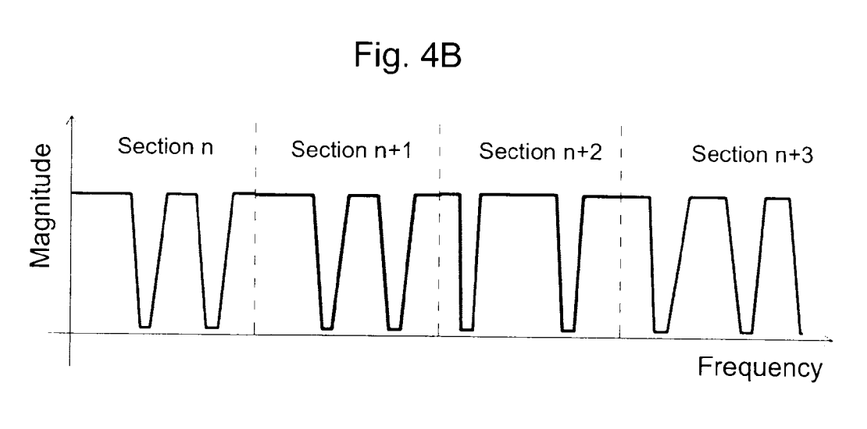

FIG. 4A shows an example of a spectrum of nowadays digitally generated transmission signals, which may have a rather rectangular shape so that discontinuities may be hard to detect. FIG. 4A shows a correctly measured section, and FIG. 4B shows a spectrum, in which a transmission error has been occurred with respect to section n+1 which is a copy of the spectrum of section n.

Figure 5A:
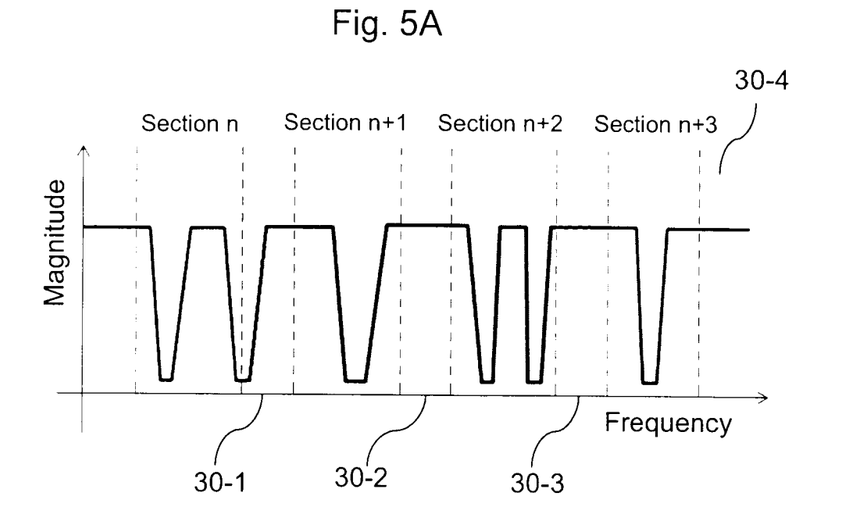
FIGS. 5A and 5B show further examples of a spectrum that may be obtained by the receiver according to a further embodiment of the present application.
Figure 5B:
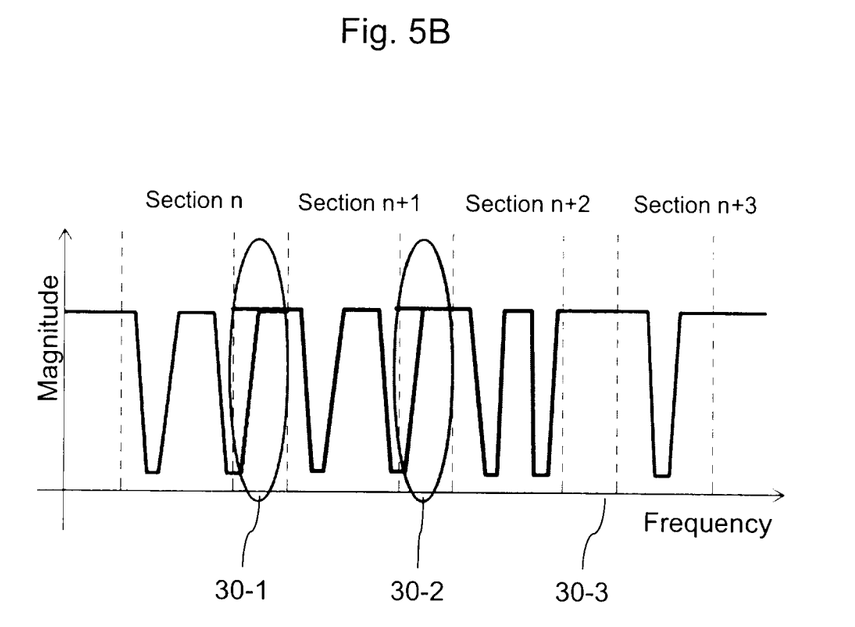

In order to detect such a transmission error, the controller 18 may be configured to set the predetermined frequency range so that neighboring frequency ranges have overlapping frequency portions. As is shown in FIG. 5A, portion 30-1 belongs to section n and to section n+1, thus forming an overlapping portion. In a similar manner, portions 30-2 and 30-3 form overlapping portions. FIG. 5B shows spectrum measurements in which due to an error, a spectrum corresponding to section n has been received instead of the spectrum corresponding to section n+1. Due to the overlapping frequency ranges a transmission error can be easily detected by analyzing the spectral differences in the overlapping portions. According to this embodiment, the analysis device 20 may be configured to analyze the spectral differences in the overlapping portions.

The size of the overlapping portions may, for example, be a portion of the bandwidth that is usually assigned to a single receiver. For example, in a case in which a 40 MHz bandwidth is assigned to each single receiver, the overlapping portion may be 10 or 20 MHz. The size of the overlapping portion may be fixed or may depend from a change in the spectrum. For example, if the processing device detects a transition from a decreasing or increasing magnitude to a constant magnitude or vice versa, the next section can be determined so that it overlaps with this transition.

As a further example, the controller 18 may instruct the interface to measure a specific section a plurality of number of times. Then, the analysis device may be configured to compare these multiply measured sections with each other to detect a transmission error. After a transmission error has been detected, the affected section can be easily replaced by a new section measurement. Measuring a plurality of times may also allow for detection of analog TV signals as their spectral power density strongly varies over time. Accordingly, in this embodiment the analysis device 20 may detect the strongly varying spectral power density from the comparison of the multiply measured sections with each other. In the context of the present embodiment "strongly varying" means that the variation of the spectral power density is larger than that would be expected due to usual fluctuations caused by measurement accuracy and fluctuations of the environmental conditions. Further, the detected frequency ranges corresponding to the analog TV signals may be removed from the blind channel scan at an early processing stage. This notably reduces the overall scan time.

Accordingly, the receiver illustrated by way of example in FIG. 2, is configured to perform a blind channel scan over the whole broadband spectrum in a single cable system. Further, the receiver accomplishes a simple and fast detection of an error in a DiSEqC control sequence transmission during a blind channel scan in single cable installation directly based on the measured spectrum information, for example, the average magnitude. By implementing the receiver according to embodiments of the present invention, a transmission error can be directly detected from the spectrum section that is obtained by processing the measured spectrum signal.

Figure 6:
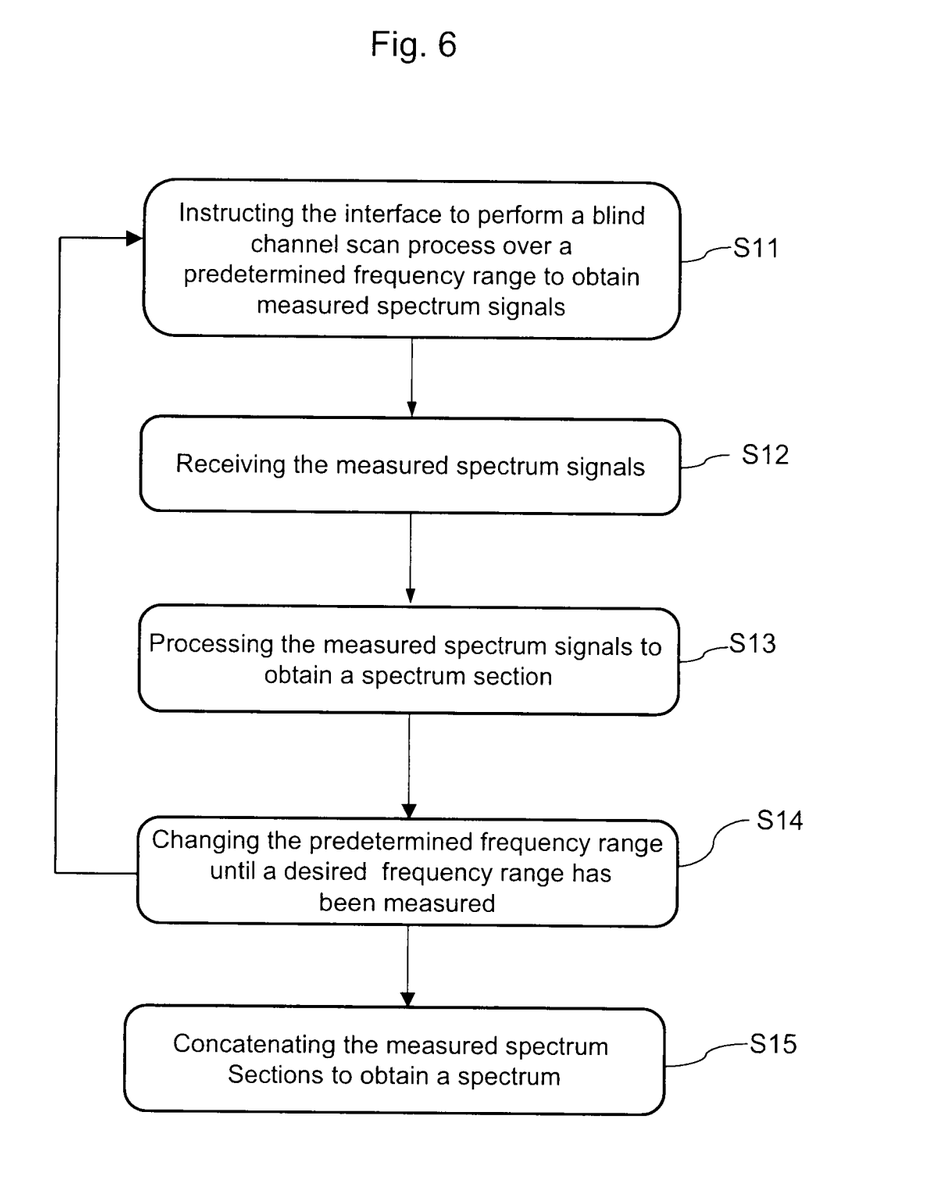
FIG. 6 illustrates a method according to an embodiment.

FIG. 6 shows a flow diagram of the method for operating a satellite receiver according to an embodiment. As is shown, a method of operating a satellite receiver in a single cable system, the satellite receiver being configured to receiver satellite signals via an interface, comprises instructing the interface to perform a blind channel scan process over a predetermined frequency range to obtain measured spectrum signals (step S11), receiving the measured spectrum signals (step S12), processing the measured spectrum signals to obtain a spectrum section (step S13), changing the predetermined frequency range until a desired frequency range has been measured (step S14), and concatenating the measured spectrum sections to obtain a spectrum (step S15). After changing the predetermined frequency range, the interface is instructed to perform a blind channel scan process over the changed frequency range. This procedure is repeated until the whole frequency region of interest has been measured. Thereafter, the measured power density may be analyzed in order to estimate the frequency positions of available transponders, for example in a similar manner as in conventional receivers.

Figure 7:
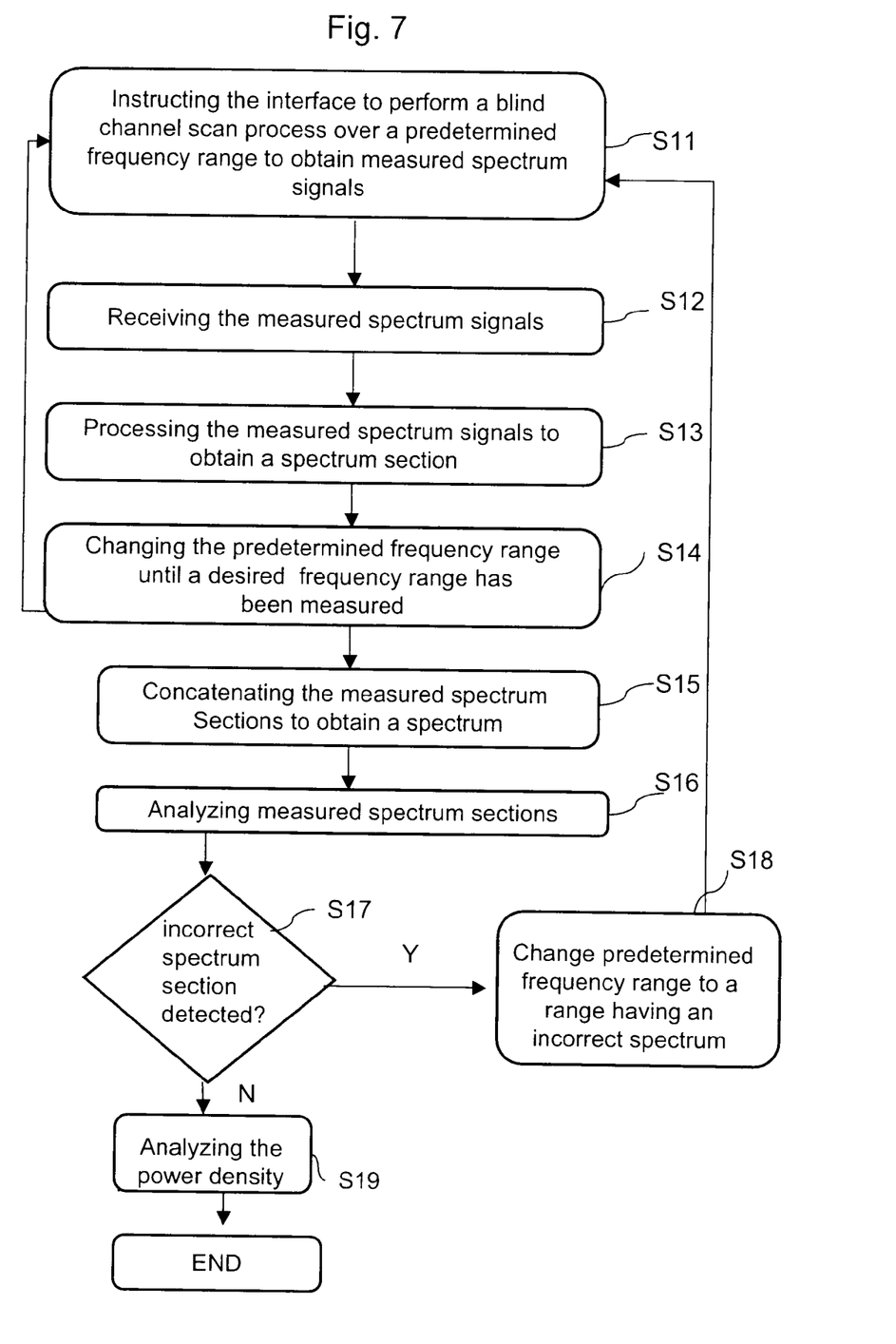
FIG. 7 illustrates a method according to a further embodiment.

FIG. 7 shows a flow diagram of the method for operating a satellite receiver according to another embodiment. The method illustrated in FIG. 7 comprises the same steps as shown in Figure and further analyzing spectrum sections S16 to detect a transmission error. If it is determined in step S17 that the spectrum does not contain incorrect spectrum sections, the method for measuring the spectrum is completed and the method may advance to step S19 in which the power density is analyzed in order to estimate the frequency positions of available transponders, for example in a similar manner as in conventional receivers. On the other hand, when it is determined in step S17 that the spectrum contains incorrect spectrum sections, the method proceeds to step S18, in which the predetermined frequency range is changed to a frequency range in which the incorrect spectrum was measured. Thereafter, the method advances to step S 11, in which the interface is instructed to perform a blind channel scan over the newly set frequency range.

In step S14 of FIG. 7, the predetermined frequency range may be changed so that adjacent frequency sections having overlapping portions are measured. Alternatively, the same frequency section may be measured a plurality of times. If the same frequency section is measured a plurality of times, optionally analog TV signals may be detected by detecting a varying power density in a specific frequency range. For example, the specific frequency range corresponding to the analog TV signals may be removed before step S19 in which the power density is analyzed in order to estimate the frequency positions of available transponders.

As is clearly to be understood, the present application comprises any kind of subcombination of the various features described in the present specification and defined by the claims.

While embodiments of the invention have been described above, it is obvious that further embodiments may be implemented. Accordingly, this spirit and scope of the appended claims should not be limited to the description of the embodiments contained herein.

The invention claimed is:

1. A satellite receiver configured to receive receiver satellite signals via an interface, the satellite receiver comprising:
   a controller configured to:
   instruct the interface to perform a blind channel scan process over a predetermined frequency range to obtain measured spectrum signals;
   change the predetermined frequency range until a desired frequency range has been measured; and
   a processing device configured to:
   receive the measured spectrum signals;
   process the measured spectrum signals to obtain a spectrum section and concatenate the measured spectrum sections to obtain a spectrum.

2. The satellite receiver according to claim 1, wherein the controller is configured to change the predetermined frequency range so that neighbouring frequency ranges have overlapping frequency portions.

3. The satellite receiver according to claim 1, wherein the controller is configured to instruct the interface to perform a blind channel scan a plurality of times over the same frequency range.

4. The satellite receiver according to claim 3, further comprising an analysis device that is configured to detect a varying power density in a specific frequency range to detect analog TV signals.

5. The satellite receiver according to claim 4, wherein the processing device is configured to remove the specific frequency range having the varying power density from the spectrum.

6. The satellite receiver according to claim 1, further comprising an analysis device that is configured to detect a transmission error by analyzing spectrum sections.

7. The satellite receiver according to claim 6, wherein the analysis device is configured to compare spectrum sections measured for the same frequency portions to detect a transmission error.

8. The satellite receiver according to claim 6, wherein the analysis device is configured to determine whether adjacent spectrum sections are continuous at a boundary thereof.

9. A communication system comprising:
an antenna for receiving a satellite signal;
an interface connected to a single cable; and
a plurality of receivers according to claim 1 connected to the single cable,
wherein the interface is configured to transmit the received satellite signal to one of the receivers via the single cable.

10. A method of operating a satellite receiver configured to receive satellite signals via an interface, the method comprising:
instructing the interface to perform a blind channel scan process over a predetermined frequency range to obtain measured spectrum signals;
receiving the measured spectrum signals;
processing the measured spectrum signals to obtain a spectrum section
changing the predetermined frequency range until a desired frequency range has been measured; and
concatenating the measured spectrum sections to obtain a spectrum.

11. The method according to claim 10, wherein the predetermined frequency range is changed so that neighbouring frequency ranges have overlapping frequency portions.

12. The method according to claim 10, wherein a blind channel scan is performed a plurality of times over the same frequency range.

13. The method according to claim 12, further comprising detecting a varying power density in a specific frequency range to detect analog TV signals.

14. The method according to claim 13, further comprising removing the specific frequency range having the varying power density from the spectrum.

15. The method according to claim 10, further comprising analyzing spectrum sections to detect a transmission error.

16. The method according to claim 15, wherein analyzing comprises comparing spectrum sections measured for the same frequency portions to detect a transmission error.

17. The method according to claim 15, wherein analyzing comprises determining whether adjacent spectrum sections are continuous at a boundary thereof.

18. A computer program comprising computer program code means adapted to perform all the steps of claim 10, when the program is run on a computer.

19. A satellite receiver configured to receive satellite signals via an interface, the satellite receiver comprising:
means for instructing the interface to perform a blind channel scan process over a predetermined frequency range to obtain measured spectrum signals, the means for instructing being configured to change the predetermined frequency range until a desired frequency range has been measured;
means for receiving the measured spectrum signals;
means for processing the measured spectrum signals to obtain a spectrum section, and
means for concatenating the measured spectrum sections to obtain a spectrum.

* * * * *